(12) United States Patent
Harper

(10) Patent No.: US 7,108,517 B2
(45) Date of Patent: Sep. 19, 2006

(54) MULTI-SITE CHIP CARRIER AND METHOD

(75) Inventor: Patrick Henry Harper, Phoenix, AZ (US)

(73) Assignee: Wells-CTI, LLC, Vancouver, WA (US)

( * ) Notice: Subject to any disclaimer, the term of this patent is extended or adjusted under 35 U.S.C. 154(b) by 27 days.

(21) Appl. No.: 10/952,644

(22) Filed: Sep. 27, 2004

(65) Prior Publication Data

US 2006/0068614 A1    Mar. 30, 2006

(51) Int. Cl.
*H01R 12/00* (2006.01)

(52) U.S. Cl. .......................... 439/71; 439/331

(58) Field of Classification Search ............ 439/70–73, 439/330–331; 361/820
See application file for complete search history.

(56) References Cited

U.S. PATENT DOCUMENTS

| | | | | |
|---|---|---|---|---|
| 5,528,466 A * | 6/1996 | Lim et al. | .................... | 361/820 |
| 5,648,893 A * | 7/1997 | Loo et al. | .................... | 361/820 |
| 6,203,332 B1 * | 3/2001 | Tashiro et al. | ................ | 439/71 |
| 6,464,513 B1 * | 10/2002 | Momenpour et al. | ......... | 439/73 |
| 6,665,929 B1 * | 12/2003 | Bright | .......................... | 29/837 |
| 6,956,392 B1 * | 10/2005 | Wright | ....................... | 324/760 |

OTHER PUBLICATIONS

Wells-CTI, Technical Drawing entitled "15×15 27mm 1.5mm Pitch Solder Grid Array Socket," Part No. 654XXX227XX0901, Revision C1.

* cited by examiner

*Primary Examiner*—Michael C. Zarroli
(74) *Attorney, Agent, or Firm*—Marger Johnson & McCollom, P.C.

(57) ABSTRACT

An integrated circuit (IC) package socket device that can receive two or more IC packages and the method of operating the device. Uses for the device include burn-in in which testing and programming of dies or completed IC packages. The device can also be arranged to receive two or more types of IC packages. A pressure unit is tiltably attached to the lid of the socket device providing a resilient normal force to each of the two or more IC packages without damaging the IC packages. The pressure unit has two or more pressure pads that correspondingly apply the resilient normal force to each of the two or more IC packages. The IC packages are received in recesses where the recesses are typically arranged in an array with the pressure pads in the pressure unit arranged so as to align with the array of recesses.

28 Claims, 4 Drawing Sheets

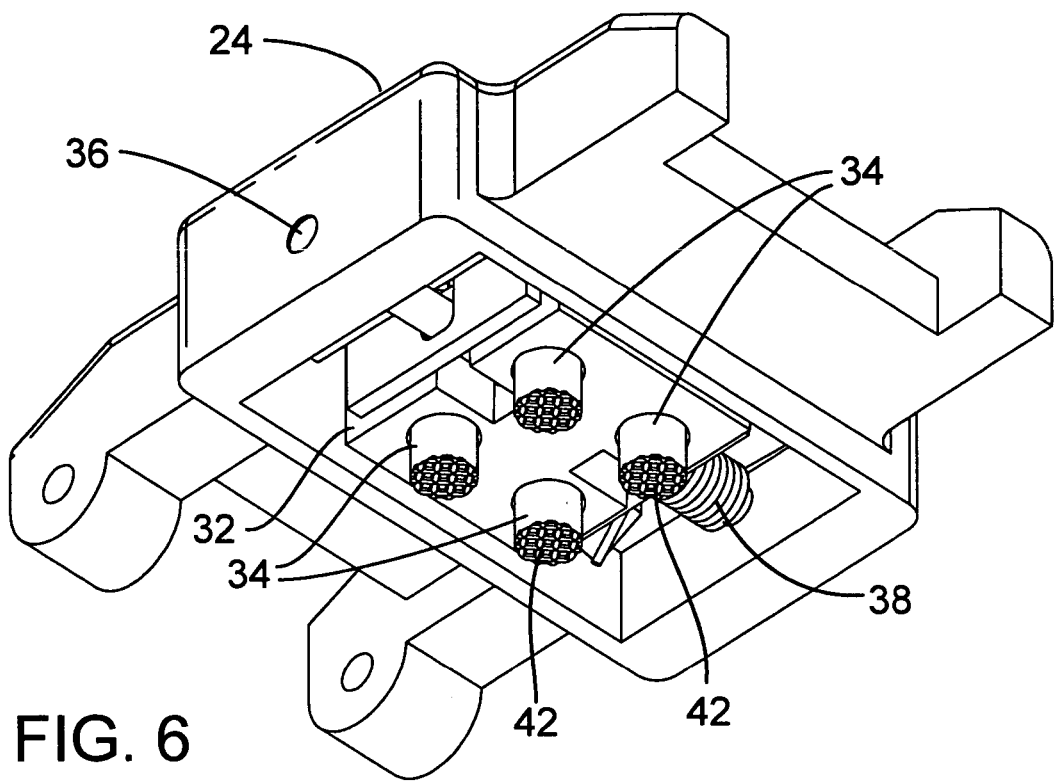
FIG. 6
FIG. 7
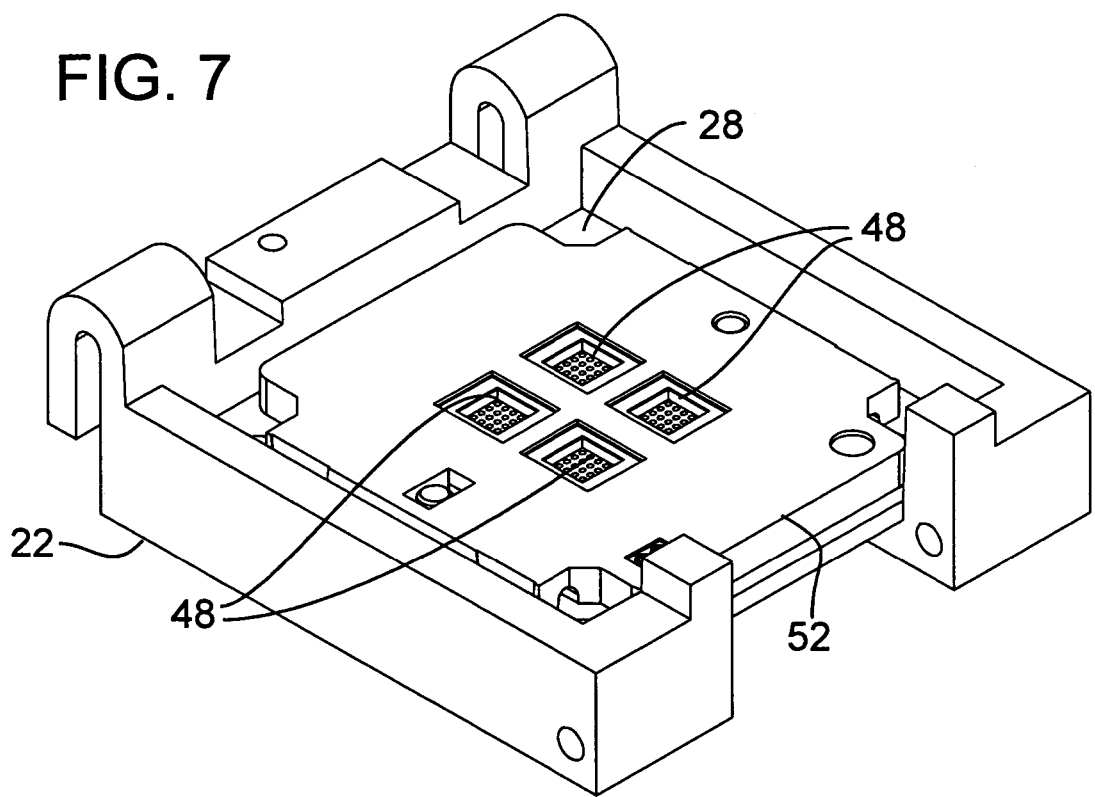

MULTI-SITE CHIP CARRIER AND METHOD

FIELD OF THE INVENTION

This invention relates to integrated circuit socket devices.

BACKGROUND AND SUMMARY OF THE INVENTION

Integrated circuit (IC) packages must be tested after their manufacture. Testing can include burn-in, testing and programming of IC packages. The integrated circuits are temporarily installed on a circuit board, tested, and then removed from the circuit board. Accordingly, sockets are necessary to install the IC packages on the printed circuit board for testing. These sockets include multiple contacts to connect each of the terminals of the IC package to corresponding conductors on the printed circuit board. Currently, each IC package is tested in a separate socket requiring a test operator to open and close each socket each time an IC is tested. An example of such a socket is the Wells-CTI socket series number 654.

The sockets are positioned on a printed circuit board where the sockets are arranged in a relatively dense array to allow for as many IC packages as possible to be tested at once. These sockets are therefore arranged in a relatively close side-by-side and end-to-end spacing. However, the number of IC packages tested on a single board is limited to the number of sockets that can fit on the printed circuit board.

It is therefore desirable both to increase the number of IC packages tested on a single board and correspondingly reduce the number of socket devices, thereby reducing the number of times a test operator has to open and close sockets. It would be advantageous to have a socket that accommodates multiple IC packages within a single socket. More IC packages could then be tested on a single board and less time would be spent per IC package opening and closing sockets, thereby decreasing the cost of IC package manufacturing. It would also be advantageous to have a socket that accommodates more than one type or size of IC package within a single socket.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIG. 6 is a detailed perspective view of the lid of the socket device of FIG. 1 showing the multi-site pressure unit.

FIG. 7 is a detailed perspective view of the base of the socket device of FIG. 1 with the lid and latch removed.

DETAILED DESCRIPTION

Figure 1:
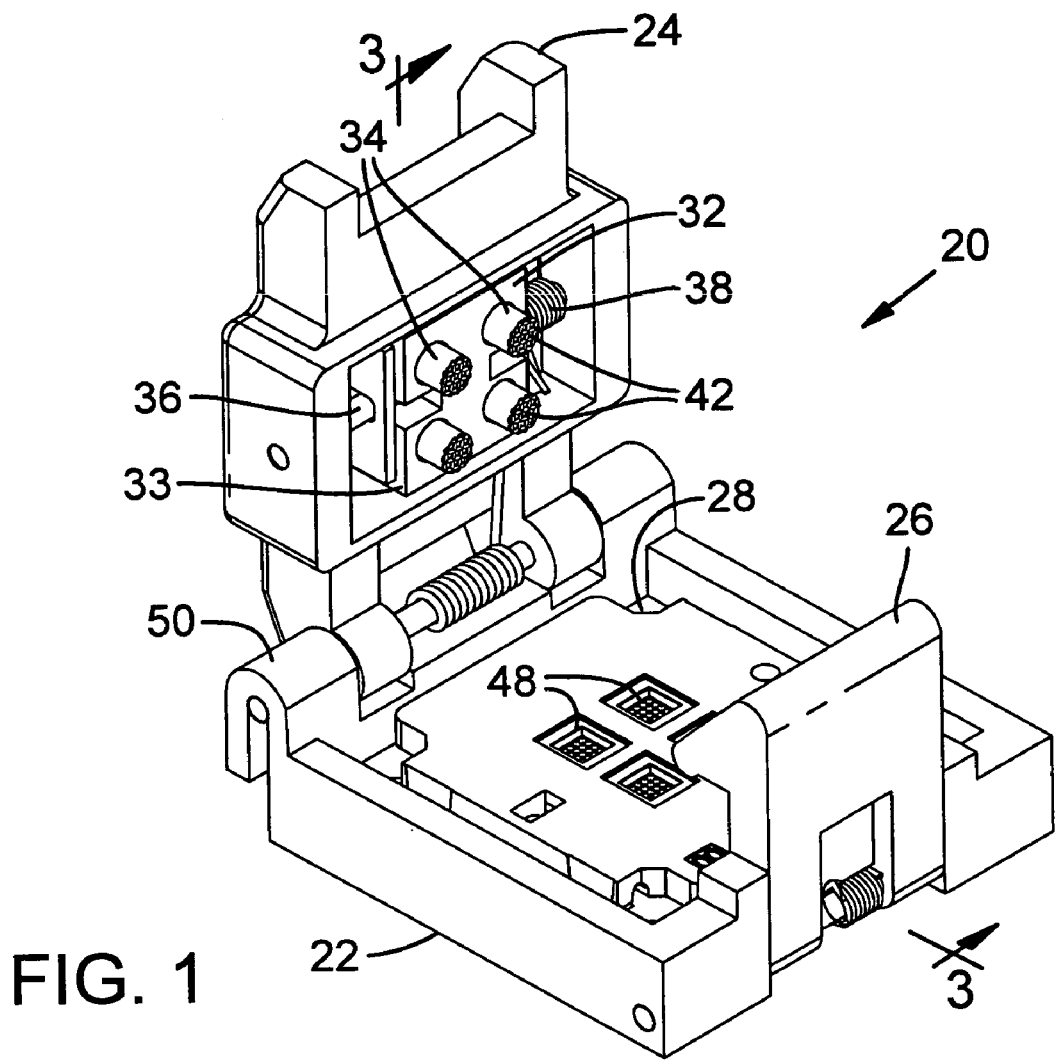
FIG. 1 is a perspective view of an IC package socket device according to the invention shown in an open position.
Figure 2:
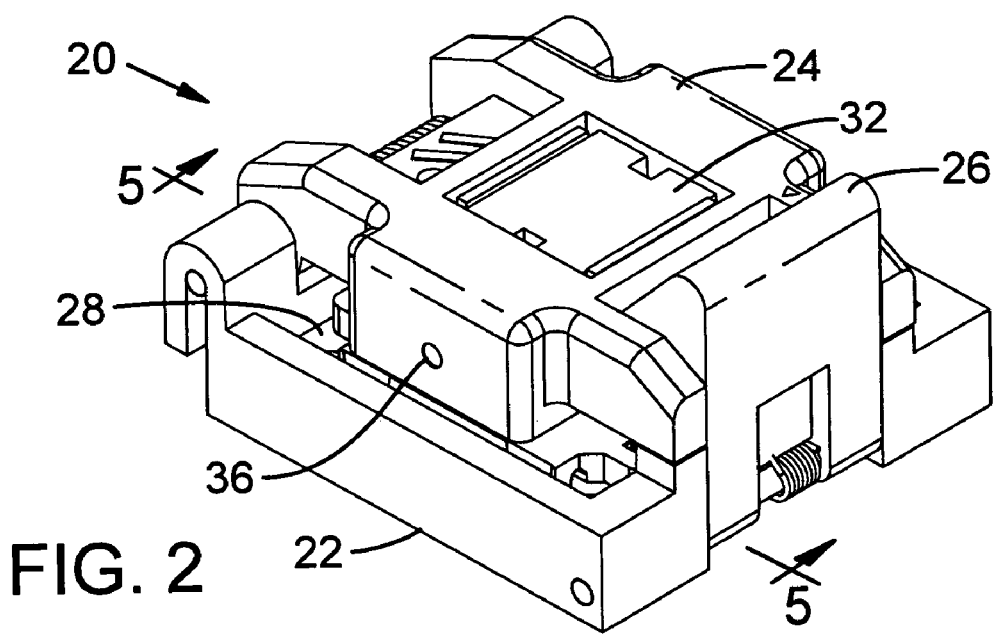
FIG. 2 is a perspective view of the IC package socket device of FIG. 1 shown in a closed position.

FIGS. 1 and 2 are perspective views of the preferred embodiment of the IC package socket device 20 according to the invention in opened and closed positions, respectively. The IC package socket device has a base 22 and a lid 24 that is latched closed onto the base 22 by a latch 26. IC package receiver area 28 in the base 22 receives multiple IC packages 30 (shown in FIGS. 4 and 5). The receiver area 28 is arranged with an array of recesses 48 to receive two or more (e.g., four) IC packages 30. The socket device can be arranged to receive a die or a packaged die and the term IC package hereinafter will encompass either option. The socket device can also be arranged to receive more than one type or size of IC package thereby increasing the versatility and usefulness of the socket device.

The lid 24 is attached to the base 22 through hinge 50. The latch 26 is positioned opposite hinge 50. A multi-site pressure unit 32 is positioned within the lid 24 in alignment, when closed, with the recesses 48. The pressure unit 32 applies a resilient normal force to the IC packages 30 when the lid 24 is in the closed and latched position shown in FIG. 2.

The multi-site pressure unit 32 includes the pressure unit housing 33 and individual pressure pads 34. The cylindrically shaped pressure pads 34 act as plungers and individually apply a resilient normal force to each of the IC packages 30 in recesses 48. The pressure pads 34 could also be otherwise shaped, such as rectangularly or triangularly. A textured contact surface 42 of the pressure pad 34 prevents the pressure pad 34 from slipping on the IC package 30 as the lid 24 is closed, thereby helping to maintain substantially equal normal forces across all of the IC packages 30 in the device 20. Additionally, texturing the contact surfaces of the pressure pads 34 prevents the pads from developing an adhesive suction force on the IC packages 30.

The multi-site pressure unit 32 is mounted in the lid 24 on transverse pivot pin 36. The pivot pin 36 allows the pressure unit 32 to rotate as the lid 24 is closed and the pressure pads 34 contact the IC packages 30. The pivot pin 36 is attached to the lid 24 and the pressure unit 32 rocks around the pivot pin 36. A torsional pivot pin spring 38 located on the pivot pin 36 biases the position of the pressure unit 32 so that the pressure pads 34 lie flat on the IC packages 30 when the device 20 is in a closed and latched position.

Figure 3:
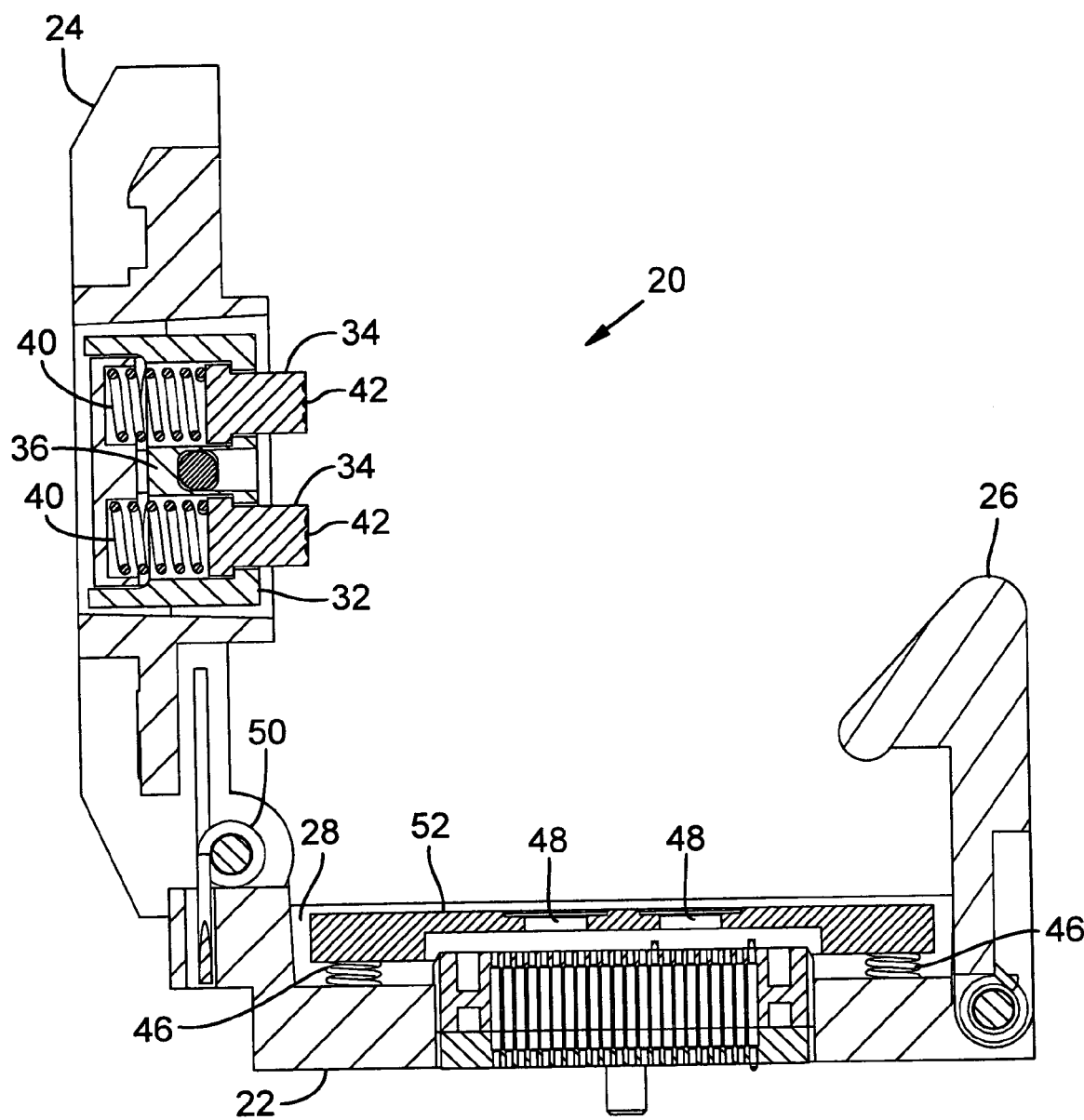
FIG. 3 is a cross-sectional view of the IC package socket device of FIG. 1 taken along line 3—3 in FIG. 1 showing the device in a fully open-position.

FIG. 3 is a cross-sectional view of the IC package socket device in FIG. 1 taken along line 3—3 in FIG. 1. The IC package receiver area 28 has a floating plate 52 positioned on floating plate compression springs 46. The floating plate 52 has multiple recesses 48 sized and shaped for receiving individual IC packages 30, one in each recess 48. The pressure pads 34 are positioned within the multi-site pressure unit 32 so as to align squarely with the array of recesses 48 in floating plate 52. (See FIGS. 4 and 5) Compression springs 40 are positioned above pressure pads 34 within cylindrical holes in the pressure unit housing 32. The pressure unit 32 attaches to lid 24 by means of the transverse pivot pin 36. The lid 24 is connected to the base 22 by means of hinge 50. Latch 26 is positioned opposite hinge 50 on the base 22 to provide a closing mechanism for the IC package socket device 20.

Figure 4:
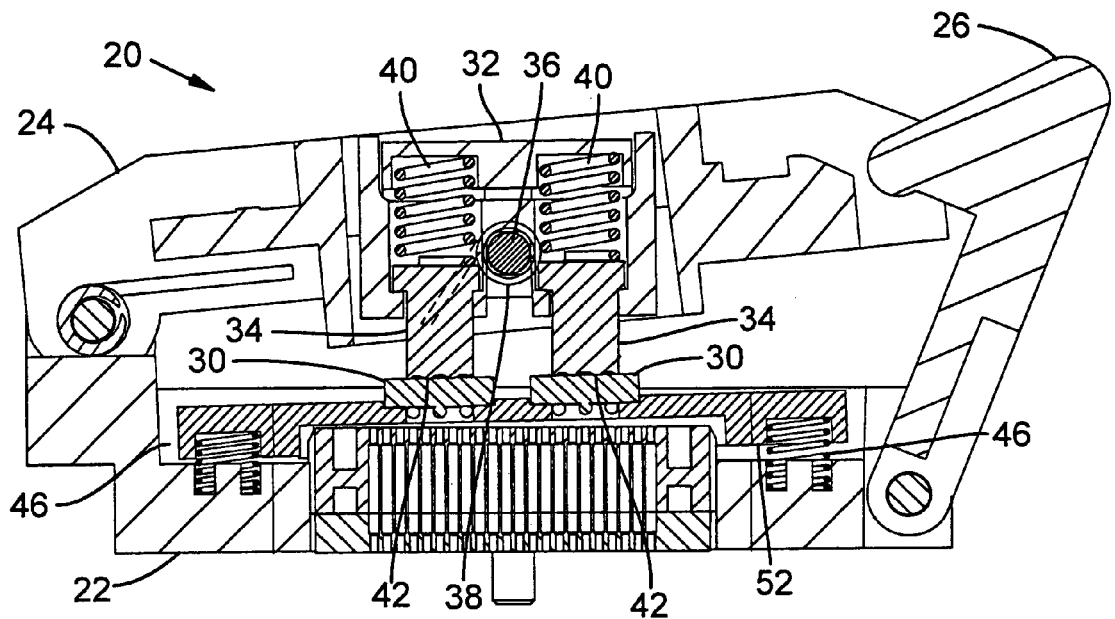
FIG. 4 is a cross-sectional view of the IC package socket device of FIG. 1 taken along line 3—3 in FIG. 1 showing the device in a partially closed position.

FIG. 4 is a cross-sectional view of the IC package socket device of FIG. 1 showing the device in a partially closed position. As the lid 24 is closed, the pressure pads 34 contact the IC packages 30 with the textured contact surface 42. Because the pressure unit 32 is tiltably mounted within the lid 24 on transverse pivot pin 36, the pressure unit rocks so that the pressure pads lie flat on the IC packages 30 as the lid 24 is closed. The floating plate compression springs 46 also allow the floating plate 52 to slant, further helping the IC packages 30 lie flat against the pressure pads 34. The torsional spring 38 provides resilient resistance to the rotational motion of the pressure unit 32. The floating plate compression springs 46 also provide resilient resistance to the force of the closing lid on the IC packages 30. The combination of resilient forces uniformly applied prevents the socket device 20 from damaging the IC packages 30 during the lid closing process.

Figure 5:
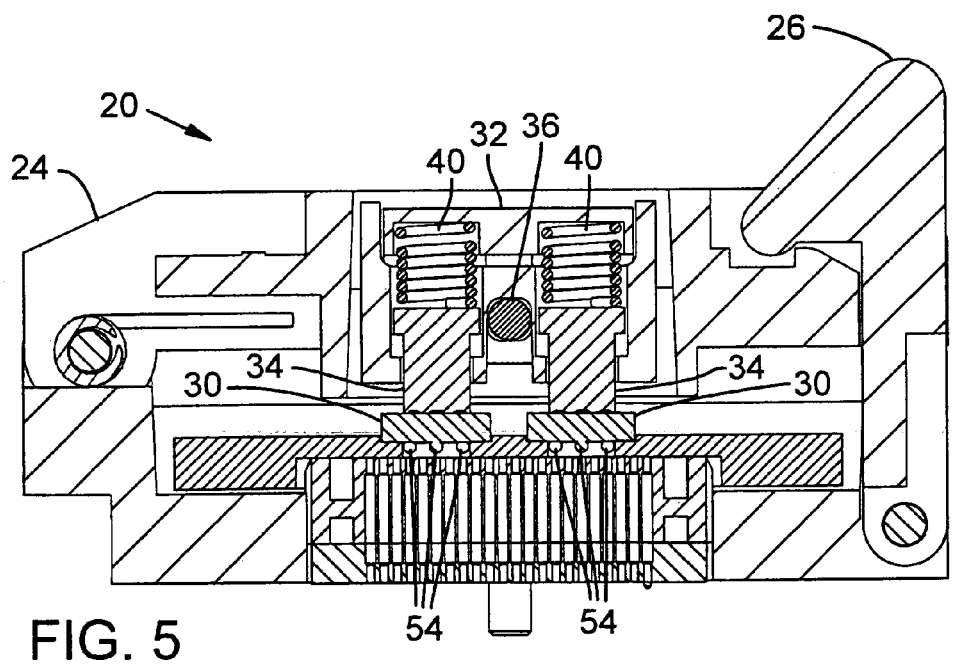
FIG. 5 is a cross-sectional view of the IC package socket device of FIG. 1 taken along line 5—5 in FIG. 2 showing the device in a fully closed and latched position.

FIG. 5 is a cross-sectional view of the IC package socket device of FIG. 1 showing the device in a fully closed and latched position. In the fully closed position with latch 26 engaging lid 24, each pressure pad 34 applies a resilient normal force to each IC package 30. The compression springs 40 positioned in the pressure unit 32 above each pressure pad 34 provide the resilient force. The resilient normal force applied by the pressure pad 34 and compression spring 40 is sufficient to press each IC package 30 into electrical connection with the electrical contacts 54 in the socket device 20. By having separate pressure pads 34 contacting separate IC packages 30, the device 20 imparts an equal force to each IC package 30. Minor variations in IC package thicknesses are accommodated through the use of separate pressure pads for each IC package.

FIG. 6 is a detailed perspective view of the lid 24 of the IC package socket device of FIG. 1. Transverse pivot pin 36 is mounted within the lid 24 and the multi-site pressure unit 32 is rotatably mounted on the transverse pivot pin 36. The torsional spring 38 biases the rotational position of the pressure unit and provides a resilient resistance to rocking motion of the pressure unit 32. Pressure pads 34 with textured contact surfaces 42 are arranged in an array in the pressure unit 32. While FIG. 6 shows a 2×2 array that accommodates four IC packages, a 1×2 array accommodating two IC packages could be used. The array is preferably arranged such that the number of rows equals the number of columns, such as the 2×2 array shown in FIG. 6. The invention anticipates larger arrays including, but not limited to, a 3×3 array accommodating nine ICs or a 4×4 array accommodating sixteen ICs. A symmetrical arrangement more easily equally distributes the force of the pressure pads 34 across all of the multiple IC packages. The arrangement of pressure pads is not limited to rectangular arrays. Arrangements including circular, hexagonal or triangular arrangements could also be used.

FIG. 7 is a detailed perspective view of the base 22 of the IC package socket device of FIG. 1 shown with the latch 26 and lid 24 removed. The floating plate 52 is positioned within the IC package receiving area 28. The floating plate 52 has an array of recesses 48 sized and shaped for receiving IC packages 30. The recesses 48 can also be shaped and sized separately to receive two or more types or sizes of IC packages within the single socket device 20. The lengths of the pressure pads and the compression springs can be changed as needed to accommodate different thicknesses of IC packages.

Operation of the Multi-Site IC Package Testing Device

Operation of the IC package socket device according to the invention includes placing a plurality of IC packages 30 into a single IC package socket device 20, one in each recess 48, and applying a separate resilient normal force to each IC package 30 by a plurality of pressure pads 34 positioned within the lid 24 of the testing device 20. The resilient normal force is applied when the lid 24 is closed and latched into place by latch 26. The operation can further include placing a plurality of types or sizes of IC packages into a single package socket device 20.

By allowing multiple IC packages 30 to be placed into a single socket device 20, an operator only has to close and open a single lid 24 for multiple IC packages. In the socket device shown in FIG. 1, the operator would open and close a single lid for every four IC packages. The multi-site socket according to the invention reduces the amount of time spent burning in, testing and programming IC packages, thereby reducing the cost of manufacturing the IC packages.

Having described and illustrated the principles of the invention in a preferred embodiment thereof, it should be apparent that the invention can be modified in arrangement and detail without departing from such principles. I claim all modifications and variation coming within the spirit and scope of the following claims.

The invention claimed is:

1. An IC package socket device comprising:
   a base;
   a lid;
   a latch;
   an IC package receiver positioned in the base and arranged to receive two or more IC packages; and,
   a multi-site pressure unit positioned in the lid that applies a resilient normal force to each of the two or more IC packages,
   wherein the multi-site pressure unit is tiltably attached to the lid.

2. The device of claim 1 in which the multi-site pressure unit further comprises two or more pressure pads that apply a resilient normal force to each of the two or more IC packages.

3. The device of claim 2 in which the two or more pressure pads comprise cylindrical plungers positioned in the multi-site pressure unit.

4. The device of claim 2 in which the multi-site pressure unit further comprises a resilient member positioned above each pressure pad to supply the resilient normal force to the IC package.

5. The device of claim 2 in which the pressure pads further comprise a textured IC package contact surface.

6. The device of claim 1 in which the lid is connected to the base by a hinge.

7. The device of claim 1, wherein the pressure unit is attached to the lid by a transverse pin and a torsional pivot pin spring is positioned on the transverse pivot pin so as to create a resilient resistance to a rotational motion around the transverse pin of the pressure unit within the lid.

8. The device of claim 1, the IC package receiver further comprising:
   a floating plate; and
   one or more compression springs positioned in the base below the floating plate,
   wherein the plate includes two or more recesses sized and shaped to receive the corresponding two or more IC packages.

9. The device of claim 8 in which the two or more recesses are sized and shaped to receive different types of IC packages.

10. The device of claim 8 in which the two or more recesses are sized and shaped to receive different sizes of IC packages.

11. The device of claim 7 in which the two or more recesses are arranged in a rectangular M×N array.

12. An IC package socket device comprising:
  a receiver;
  a lid attached to said receiver by a hinge;
  a closure mechanism positioned opposite the hinge;
  a receiving plate positioned in the receiver wherein the receiving plate has an M×N array of recesses sized and shaped to receive an IC package in each recess; and
  a pressure unit positioned in the lid comprising an M×N array of pressure pads, wherein the pressure unit is positioned so the M×N array of pressure pads correspondingly overlies the M×N array of recesses in the receiving plate,
  wherein a resilient member is positioned above each pressure pad to supply the resilient normal force.

13. The device of claim 12 in which the M×N arrays are arranged such that M defines rows of recesses and pressure pads in a direction from hinge to latch in which N defines columns of recesses and pressure pads in a direction from one side of the device to an opposite side of the device in which M is at least one and N is two or more.

14. The device of claim 12 in which the M×N arrays are arranged such that M is equal to N and M is greater than one.

15. The device of claim 12 in which the pressure pads are cylindrical plungers arranged to apply a resilient normal force to each IC package.

16. The device of claim 12 in which the pressure unit is attached to the lid by a transverse pin.

17. The device of claim 16 further comprising a torsional spring positioned on the transverse pin to apply a resilient rotational bias to the pressure unit.

18. The device of claim 12 in which the M×N array of recesses are sized and shaped to receive different types of IC packages across the array of recesses.

19. The device of claim 12 in which the M×N array of recesses are sized and shaped to receive different sizes of IC packages across the array of recesses.

20. An IC package socket arrangement comprising:
  two or more IC packages having predetermined size;
  an IC package receiver capable of receiving the two or more IC packages; and
  a lid having a means for separately applying a normal force to each of the two or more IC packages,
  wherein the means for separately applying a normal force to each IC package includes a pressure unit positioned in the lid wherein the pressure unit comprises a plurality of pressure pads with each pressure pad applying the normal force to each of the IC packages and a compression spring positioned above each of the plurality of pressure pads to impart a resilient normal force to each of the IC packages.

21. The arrangement of claim 20 in which the IC package receiver further comprises a receiving plate having an M×N array of recesses in which each recess sized and shaped for receiving an IC package.

22. The arrangement of claim 21, including a pressure unit positioned in the lid wherein said pressure unit comprises a plurality of pressure pads in wherein the pressure pads are aligned with the recesses.

23. The arrangement of claim 21 in which the M×N array is arranged such that M is at least one and N is two or more.

24. The arrangement of claim 21 in which the M×N array is arranged such that M is at least two and N is equal to M.

25. The arrangement of claim 20 in which the IC package receiver that is capable of receiving the two or more IC packages is further capable of receiving two or more types of IC packages.

26. The arrangement of claim 20 in which the IC package receiver capable of receiving the two or more IC packages is further capable of receiving two or more sizes of IC packages.

27. A method for testing a plurality of IC packages comprising:
  placing a plurality of IC packages in a single socket base wherein the base has an array of recesses sized and shaped for receiving an IC package in each recess;
  applying a resilient normal force to each of the plurality of IC packages in the base by latching a socket lid onto the socket base wherein the resilient normal force is applied to each of the IC packages by a plurality of pressure pads positioned in the socket lid in which each of the pressure pads applying a resilient normal force to a corresponding IC package,
  wherein placing a plurality of IC packages in a single socket base includes placing a plurality of sizes of IC packages in the single socket base.

28. The method of claim 27 in which placing a plurality of IC packages in a single socket base further includes placing a plurality of types of IC packages in the single socket base.

* * * * *